US010164600B2

(12) United States Patent
Kormann et al.

(10) Patent No.: US 10,164,600 B2
(45) Date of Patent: Dec. 25, 2018

(54) NFC OR RFID DEVICE RF DETUNING DETECTION AND DRIVER OUTPUT POWER REGULATION

(71) Applicant: NXP B.V., Eindhoven (NL)

(72) Inventors: Leonhard Kormann, Gratkorn (AT); Markus Wobak, Graz-Puntigam (AT); Fred George Nunziata, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/881,095

(22) Filed: Oct. 12, 2015

(65) Prior Publication Data

US 2017/0104468 A1    Apr. 13, 2017

(51) Int. Cl.
| | | |
|---|---|---|
| G06K 7/10 | (2006.01) | |
| H03H 7/38 | (2006.01) | |
| H04B 5/00 | (2006.01) | |

(52) U.S. Cl.
CPC ........... *H03H 7/38* (2013.01); *G06K 7/10148* (2013.01); *G06K 7/10158* (2013.01); *G06K 7/10217* (2013.01); *H04B 5/0056* (2013.01)

(58) Field of Classification Search
CPC ........... H04B 5/00–5/02; H04W 4/008; G06K 19/0712; G06K 19/0715; G06K 19/0723; G06K 7/10128; G06K 7/10217
See application file for complete search history.

(56) References Cited

U.S. PATENT DOCUMENTS

| | | | | | |
|---|---|---|---|---|---|
| 5,418,353 | A | * | 5/1995 | Katayama | G06K 7/0008 235/375 |
| 5,703,573 | A | * | 12/1997 | Fujimoto | G01S 13/82 340/10.3 |
| 7,999,417 | B2 | * | 8/2011 | Kato | H01F 38/14 307/149 |
| 8,054,036 | B2 | * | 11/2011 | Onishi | H02J 7/025 320/108 |

(Continued)

FOREIGN PATENT DOCUMENTS

| | | |
|---|---|---|
| EP | 2779021 | 11/2014 |
| EP | 2763075 A | 12/2015 |
| WO | 2015/022450 A1 | 2/2015 |

OTHER PUBLICATIONS

Dictionary definition of "equivalent", retrieved on Dec. 15, 2016, located at http://www.dictionary.com/browse/equivalent?s=t.*

(Continued)

*Primary Examiner* — Gennadiy Tsvey

(57) ABSTRACT

A near field communication (NFC) or Radio Frequency Identification (RFID) reader device for contact-less communication includes a transmitter block connected to an antenna via a matching circuitry. An electromagnetic carrier signal and modulated data information are emitted via this main antenna. Any secondary object brought into the vicinity of the main antenna influences the primary resonant circuit resulting in a load change seen by the transmitter. This detuning can cause increased power consumption, RF (Radio Frequency) standard incompliance, and device dam- (Continued)

age. The present disclosure describes devices and methods on how to detect detuning and how to regulate the transmitter's output.

19 Claims, 9 Drawing Sheets

(56) References Cited

U.S. PATENT DOCUMENTS

| | | | | |
|---|---|---|---|---|
| 8,060,011 B2* | 11/2011 | Jin | | H02J 5/005 455/41.1 |
| 8,204,531 B2* | 6/2012 | Jin | | H02J 5/005 455/522 |
| 8,222,860 B2* | 7/2012 | Kamijo | | H02J 7/025 320/108 |
| 8,258,652 B2* | 9/2012 | Sekino | | H02J 7/025 307/104 |
| 8,588,719 B1* | 11/2013 | Mehrotra | | H03G 3/3068 375/316 |
| 8,803,365 B2* | 8/2014 | Lee | | H02J 5/005 307/104 |
| 8,994,510 B2* | 3/2015 | Restiau | | G06K 7/00 340/10.1 |
| 9,507,975 B2* | 11/2016 | Wuidart | | G06K 7/0008 |
| 9,641,016 B2* | 5/2017 | Kwon | | H02J 7/025 |
| 9,646,299 B1* | 5/2017 | Rezayee | | G06Q 20/3278 |
| 9,735,584 B2* | 8/2017 | Taylor | | H02J 5/005 |
| 9,756,578 B2* | 9/2017 | Wong | | H04W 52/246 |
| 2001/0015697 A1* | 8/2001 | Wuidart | | G06K 7/0008 340/8.1 |
| 2002/0044096 A1* | 4/2002 | Chung | | G06K 7/10336 343/742 |
| 2004/0256460 A1* | 12/2004 | Charrat | | G06K 7/0008 235/451 |
| 2005/0159913 A1* | 7/2005 | Ariyoshi | | G06K 7/0008 702/122 |
| 2006/0109828 A1* | 5/2006 | Yoshino | | H04W 52/10 370/338 |
| 2006/0289649 A1* | 12/2006 | Sugiura | | G06K 7/0008 235/451 |
| 2007/0122941 A1* | 5/2007 | Ota | | G06K 7/0008 438/107 |
| 2008/0024280 A1* | 1/2008 | Kato | | G06K 7/0008 340/10.3 |
| 2008/0157909 A1* | 7/2008 | Chen | | H02J 5/005 336/105 |
| 2008/0200119 A1* | 8/2008 | Onishi | | H04B 1/3883 455/41.1 |
| 2008/0266060 A1* | 10/2008 | Takei | | G06K 7/0008 340/10.4 |
| 2009/0001932 A1* | 1/2009 | Kamijo | | H02J 5/005 320/108 |
| 2009/0237251 A1* | 9/2009 | Kim | | G06K 7/0008 340/572.1 |
| 2009/0243397 A1* | 10/2009 | Cook | | H02J 5/005 307/104 |
| 2009/0273454 A1* | 11/2009 | Onozuka | | G06K 7/0008 340/10.51 |
| 2009/0302800 A1* | 12/2009 | Shiozaki | | H02J 7/025 320/108 |
| 2010/0001847 A1* | 1/2010 | Takaishi | | G06K 7/0008 340/10.34 |
| 2010/0066349 A1* | 3/2010 | Lin | | H02J 5/005 324/103 R |
| 2010/0080270 A1* | 4/2010 | Chen | | H03F 1/223 375/219 |
| 2010/0237943 A1* | 9/2010 | Kim | | H03F 3/45475 330/254 |
| 2010/0240324 A1* | 9/2010 | Okada | | G06K 7/0008 455/75 |
| 2010/0328045 A1* | 12/2010 | Goto | | G06K 7/0008 340/10.4 |
| 2011/0059694 A1 | 3/2011 | Audic | | |
| 2011/0102151 A1* | 5/2011 | Shin | | G06K 7/0008 340/10.1 |
| 2011/0269496 A1* | 11/2011 | Shinohara | | H04W 52/283 455/522 |
| 2012/0098348 A1* | 4/2012 | Inoue | | B60L 11/123 307/104 |
| 2012/0193993 A1* | 8/2012 | Azancot | | H02J 5/005 307/104 |
| 2012/0235506 A1* | 9/2012 | Kallal | | H02J 5/005 307/104 |
| 2012/0242160 A1* | 9/2012 | Tseng | | H04B 5/0037 307/104 |
| 2012/0329405 A1* | 12/2012 | Lee | | H02J 17/00 455/73 |
| 2013/0005252 A1* | 1/2013 | Lee | | H04B 5/0037 455/41.1 |
| 2013/0020879 A1* | 1/2013 | Kihara | | H02J 5/005 307/104 |
| 2013/0062959 A1* | 3/2013 | Lee | | H04B 5/0031 307/104 |
| 2013/0203349 A1* | 8/2013 | Hillan | | H04B 5/02 455/41.1 |
| 2013/0222119 A1* | 8/2013 | Tietke | | G06K 7/0008 340/10.5 |
| 2013/0237150 A1* | 9/2013 | Royston | | H04B 5/0025 455/41.1 |
| 2013/0241304 A1* | 9/2013 | Bae | | H04B 5/0037 307/104 |
| 2013/0288595 A1* | 10/2013 | Lee | | H01F 38/14 455/39 |
| 2013/0307468 A1* | 11/2013 | Lee | | H02J 7/0052 320/108 |
| 2013/0344805 A1 | 12/2013 | Lefley | | |
| 2014/0009109 A1* | 1/2014 | Lee | | H02J 17/00 307/104 |
| 2014/0080409 A1* | 3/2014 | Frankland | | H02J 5/005 455/41.1 |
| 2014/0103869 A1* | 4/2014 | Radovic | | H04B 5/0037 320/108 |
| 2014/0120833 A1* | 5/2014 | Hillan | | H04B 5/0031 455/41.1 |
| 2014/0129425 A1* | 5/2014 | Yang | | G06K 7/10158 705/39 |
| 2014/0139322 A1* | 5/2014 | Wang | | H04B 5/0031 340/10.5 |
| 2014/0159653 A1* | 6/2014 | Von Novak | | H04B 5/0031 320/108 |
| 2014/0184150 A1 | 7/2014 | Walley | | |
| 2014/0227986 A1* | 8/2014 | Kanno | | H04B 5/0031 455/115.1 |
| 2014/0266036 A1* | 9/2014 | Jung | | G01R 29/0814 320/108 |
| 2014/0266627 A1* | 9/2014 | Padilla | | G06K 7/0008 340/10.1 |
| 2014/0346890 A1* | 11/2014 | Haseno | | H02J 5/005 307/104 |
| 2014/0354223 A1* | 12/2014 | Lee | | H02J 5/005 320/108 |
| 2014/0357190 A1* | 12/2014 | Bouvet | | H04B 5/0093 455/41.1 |
| 2014/0361739 A1* | 12/2014 | Kwak | | H02J 5/005 320/108 |
| 2014/0368053 A1* | 12/2014 | Lee | | H01F 38/14 307/104 |
| 2014/0370803 A1* | 12/2014 | Haverinen | | H04B 5/0031 455/41.1 |
| 2015/0008756 A1* | 1/2015 | Lee | | H02J 17/00 307/104 |
| 2015/0054355 A1* | 2/2015 | Ben-Shalom | | H04B 5/0037 307/104 |
| 2015/0079903 A1* | 3/2015 | Song | | H04W 4/008 455/41.1 |
| 2015/0118963 A1* | 4/2015 | Yoon | | H04B 5/0031 455/41.1 |

(56) References Cited

U.S. PATENT DOCUMENTS

| | | | |
|---|---|---|---|
| 2015/0162785 A1* | 6/2015 | Lee .................. | H02J 17/00 |
| | | | 307/104 |
| 2015/0177293 A1* | 6/2015 | McFarthing .......... | G01R 21/06 |
| | | | 340/870.3 |
| 2015/0178525 A1 | 6/2015 | Lee et al. | |
| 2015/0180240 A1* | 6/2015 | Kwon ................ | H02J 5/005 |
| | | | 307/104 |
| 2015/0270876 A1* | 9/2015 | Kim ................. | H04B 5/0081 |
| | | | 455/41.1 |
| 2015/0295608 A1 | 10/2015 | Merlin et al. | |
| 2016/0087691 A1* | 3/2016 | Van Wageningen .... | H02J 5/005 |
| | | | 307/104 |
| 2016/0134334 A1* | 5/2016 | Park ................ | H02J 5/005 |
| | | | 307/104 |

OTHER PUBLICATIONS

Extended European Search Report for Patent Appln. No. 16190659.9 (dated Mar. 2, 2017).

Prashant Dekate; "Automatic Antenna Tuning Can Compensate for Environmental Changes Affecting RFID Readers"; Publsihed on Wireless Design & Development, http://www.wirelessdesignmag.com; 2012; 5 pgs.

* cited by examiner

NFC OR RFID DEVICE RF DETUNING DETECTION AND DRIVER OUTPUT POWER REGULATION

FIELD

The described embodiments relate generally to devices and methods for NFC (near field communication) or RFID (Radio-frequency identification), and more particularly to devices and methods that provide for NFC or RFID device RF (Radio frequency) detuning detection and driver output power regulation.

BACKGROUND

Wireless communication technologies, such as those used for NFC or ISO 14443 devices, communicate with each other via magnetic field induction in close distance. Each device features an antenna. The primary device ("reader" or "initiator") generates the magnetic field which can be used to power secondary devices like passive transponders. Modulation schemes applied to the magnetic fields are used for communication purpose between the devices.

The primary device uses a transmitter to generate the emitted radio frequency (RF) field. A matching circuitry is used to transform and adapt the antenna impedance to the emitting device's transmitter. A low ohmic matching impedance is generally used for increased power transmission.

One limiting factor of the operating volume size is the emitted RF power of the primary device. Applications like contact-less payment systems require a specific operating distance. As the primary device's antenna size is often a constraint to the product, high output power transmitters are required.

The primary and secondary devices form a coupled wireless resonant circuit. If the coupling between the components is increased, the primary resonant circuit will be loaded and detuned. This results in a different load impedance seen by the primary device's transmitter, possibly causing an increased driver current and increased RF field emission. Regulatory bodies and RF standards limit the maximum allowed emitted RF power. Therefore, incompliance of the application system can occur in case of detuning. Furthermore, increased current consumption can be linked to device damage and reduced user experience in case of battery powered devices.

Therefore, it is desirable to have devices and methods that can provide for NFC or RFID device RF detuning detection and driver output power regulation.

SUMMARY

This specification discloses devices and methods that can provide for NFC or RFID device RF detuning detection and driver output power regulation. In a first embodiment, a sensor within a transmitter monitors a transmitter (TX) current and/or voltage, so that a detuning of an antenna and matching network can be detected by a change in the TX current and/or voltage. Then, in response to detection of the detuning, the TX current is regulated. This is direct regulation. In a second embodiment, a sensor monitors a voltage or current of an antenna and matching network, so that a detuning of the antenna and matching network can be detected by a change in the voltage or current of the antenna and matching network. Then, in response to detection of the detuning, the TX current is regulated. This is indirect regulation. In a third embodiment, the first and second embodiments can be combined, so that a first sensor within a transmitter monitors a transmitter (TX) current and/or voltage, while a second sensor monitors a voltage or current of an antenna and matching network. Subsequently, a detuning of an antenna and matching network can be detected by a change in the TX current and/or voltage, and/or a change in the voltage or current of the antenna and matching network. Then, in response to detection of the detuning, the TX current is regulated. This is combined regulation.

RF detuning detection and driver output power regulation is important, because with certain antenna configuration, the maximum allowed driver current can be exceeded when the antenna is detuned with a card. Even though careful antenna design can take care to reduce the maximum current under different detuning scenarios, the maximum allowed driver current can still be exceeded. Therefore, there is need for devices and methods that can provide for NFC or RFID device RF detuning detection and driver output power regulation.

In one embodiment, a method for detuning detection and transmitter (TX) current regulation is disclosed. The method includes monitoring, by a sensor within a transmitter, a transmitter (TX) current and/or voltage. The method also includes detecting a detuning of an antenna and matching network by a change in the TX current and/or voltage. The method further includes, in response to detection of the detuning, regulating the TX current. In one embodiment, regulation of the TX current is achieved by changing a transmitter supply voltage or a transmitter internal resistance. In one embodiment, changing the transmitter supply voltage or the transmitter internal resistance is controlled using a control unit. In one embodiment, changing the transmitter supply voltage or the transmitter internal resistance is performed by an active attenuator. In one embodiment, the TX current is regulated by using a plurality of gears, wherein each one of the plurality of gears represents a discrete power configuration for the transmitter. In one embodiment, the transmitter is a Near Field Communication (NFC) transmitter or a Radio Frequency Identification (RFID) transmitter.

In one embodiment, a method for detuning detection and transmitter (TX) current regulation is disclosed. The method includes monitoring a voltage or current of an antenna and matching network. The method also includes detecting a detuning of the antenna and matching network by a change in the voltage or current of the antenna and matching network. The method further includes, in response to detection of the detuning, regulating the TX current. In one embodiment, regulation of the TX current is achieved by changing a transmitter supply voltage or a transmitter internal resistance. In one embodiment, changing the transmitter supply voltage or the transmitter internal resistance is controlled using a control unit. In one embodiment, changing the transmitter supply voltage or the transmitter internal resistance is performed by an active attenuator. In one embodiment, the step of monitoring the voltage or current of the antenna and matching network includes monitoring the voltage or current at one or more nodes of the antenna and matching network. In one embodiment, the TX current is regulated by using a plurality of gears, wherein each one of the plurality of gears represents a discrete power configuration for the transmitter. In one embodiment, the method further includes the steps of: (1) monitoring, by a sensor within a transmitter, a transmitter (TX) current and/or voltage, and (2) detecting a detuning of the antenna and matching network by a change in the TX current and/or voltage and/or a change in the voltage or current of the antenna and matching network. In one embodiment, the transmitter is a Near Field Communication (NFC) transmitter or a Radio Frequency Identification (RFID) transmitter.

In one embodiment, a device for detuning detection and transmitter (TX) current regulation is disclosed. The device includes an active attenuator configured to generate a transmitter (TX) voltage, an antenna and matching circuit configured to be driven by a TX current corresponding to the TX voltage, a first sensor configured to monitor the TX current and/or voltage, a second sensor configured to monitor a voltage or current of the antenna and matching network, and a control unit. The control unit is configured to detecting a detuning of the antenna and matching network based on a change in the TX current and/or voltage and/or a change in the voltage or current of the antenna and matching network, and, in response to detection of the detuning, regulating the TX current. In one embodiment, the control unit regulates the TX current by changing a TX supply voltage or a TX internal resistance. In one embodiment, the device further includes a pre-driver configured to generate an amplified signal for input to the active attenuator. In one embodiment, the second sensor monitors the voltage or current of the antenna and matching network at one or more nodes of the antenna and matching network. In one embodiment, the TX current is regulated by using a plurality of gears, wherein each one of the plurality of gears represents a discrete power configuration for the transmitter. In one embodiment, the device is a Near Field Communication (NFC) device or a Radio Frequency Identification (RFID) device.

The above summary is not intended to represent every example embodiment within the scope of the current or future Claim sets. Additional example embodiments are discussed within the Figures and Detailed Description below.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Representative devices and methods according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other embodiments are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Figure 1:
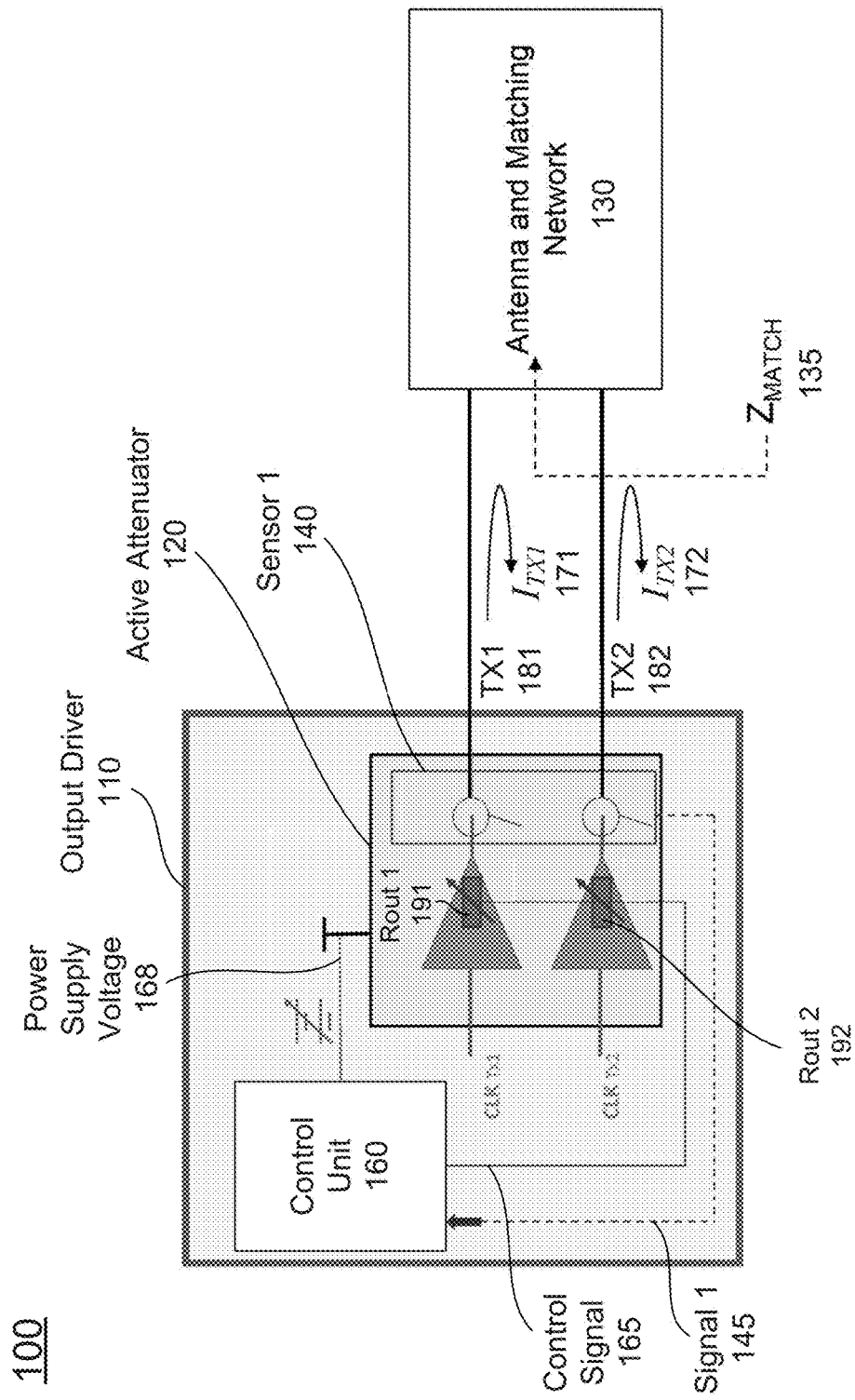
FIG. 1 shows a device (configured for detuning detection and driver output power regulation) that can detect detuning by monitoring for a change in the transmitter (TX) current (i.e., direct regulation), in accordance with some example embodiments.

FIG. 1 shows a device 100 configured for detuning detection and driver output power regulation, in accordance with some example embodiments. In particular, FIG. 1 shows that device 100 can detect detuning by monitoring for a change in the transmitter (TX) current (i.e., direct regulation), in accordance with some example embodiments.

FIG. 1 shows that an output driver 110 of a transmitter is connected to an antenna by means of a matching network. In FIG. 1, the antenna and matching network is labelled as a component 130, which has a corresponding impedance $Z_{MATCH}$ 135. Changing the load on the antenna (such as reading a card) can lead to detuning which changes the impedance $Z_{MATCH}$ 135 at the output of the output driver 110. This leads to a change of the transmitter current $I_{TX1}$ 171 and $I_{TX2}$ 172. Therefore, detuning of the antenna and matching network 130 can be detected by a change in the transmitter (TX) current (i.e., $I_{TX1}$ 171 and $I_{TX2}$ 172). Then, in response to detection of the detuning, the TX current can be regulated. This regulation of the TX current results in a reduced driver current and reduced RF field emission. This allows the transmitter to achieve compliance of the application system in case of detuning, since regulatory bodies and RF standards limit the maximum allowed emitted RF power. Furthermore, the reduced current consumption can minimize device damage and enhance user experience in case of battery powered devices.

FIG. 1 shows that the output driver 110 of the transmitter includes an active attenuator 120 at the output stage. The active attenuator 120 can be configured to generate a transmitter (TX) voltage. In turn, the antenna and matching circuit 130 can be configured to be driven by a TX current corresponding to the TX voltage.

FIG. 1 shows that the active attenuator 120 includes a sensor 1 (labelled 140), which can be used to monitor the transmitter (TX) current (i.e., $I_{TX1}$ 171 and $I_{TX2}$ 172). In one embodiment, only the TX current is monitored, so that detuning of the antenna and matching network is detected by a change in the TX current. It is not shown in FIG. 1, but in one embodiment, only the TX voltage is monitored, so that detuning of the antenna and matching network is detected by a change in the TX voltage. This is because detuning of the antenna and matching network can lead to both a change in the TX current and voltage. In one embodiment, both the TX current and voltage are monitored, so that detuning of the antenna and matching network is detected by a change in both the TX current and voltage. This is because detuning of the antenna and matching network can be better detected by monitoring both the change in the TX current and voltage. In one embodiment, the detuning can be detected by monitoring: (1) only the TX current, (2) only the TX voltage, or (3) both the TX current and voltage. The detection method selected can depend on the precision and speed of detection, as well as the ease and cost of detection and implementation.

In device 100 of FIG. 1, the output driver 110 can regulate the TX current (i.e., $I_{TX1}$, $I_{TX2}$) by changing a power supply voltage (168) or internal resistances (i.e., $R_{OUT}1$, $R_{OUT}2$), depending on the sensed current shift of $I_{TX1}$ and $I_{TX2}$. This change in the power supply voltage (168) or internal resistances (i.e., $R_{OUT}1$, $R_{OUT}2$) will in turn cause the output voltages (i.e., $V_{TX1}$, $V_{TX2}$) to be changed. In FIG. 1, internal resistances are shown as $R_{OUT}1$ (191), $R_{OUT}2$ (192), which are included in the active attenuator 120. In one embodiment, the internal resistances can be any transmitter internal resistance, which can be used to regulate the TX current. In one embodiment, the power supply voltage can be any transmitter supply voltage, which can be used to regulate the TX current. In FIG. 1, output voltages (i.e., $V_{TX1}$, $V_{TX2}$) are not shown. In one embodiment, the output voltages (i.e., $V_{TX1}$, $V_{TX2}$) can be the voltages provided at nodes TX1 (181) and TX2 (182).

FIG. 1 shows that the output driver 110 of the transmitter includes a control unit 160 configured to detecting a detuning of the antenna and matching network based on a change in the TX current and, in response to detection of the detuning, regulating the TX current. In FIG. 1, sensor 1 (140) provides a signal 1 (145) to control unit 160. Sensor 1 (140) is monitoring the TX current (i.e., $I_{TX1}$ 171, $I_{TX2}$ 172), so that signal 1 (145) can be used by the control unit 160 to detect a change in the TX current. Then, after a detuning of the antenna and matching network has been detected, the control unit 160 can in turn send a control signal 165 to the active attenuator 120 to regulate the TX current by changing the internal resistances (i.e., $R_{OUT}1$, $R_{OUT}2$). In one embodiment, the control unit 160 can regulate the TX current by changing the power supply voltage (168). In one embodiment, the control unit can regulate the TX current by changing: (1) only a transmitter supply voltage, (2) only a transmitter internal resistance, or (3) both the transmitter supply voltage and the transmitter internal resistance. The changing method selected can depend on the precision and speed of change, as well as the ease of change and the manner of implementation. In one embodiment, the control unit 160 can be partially or completely outside of the output driver 110.

Figure 2:
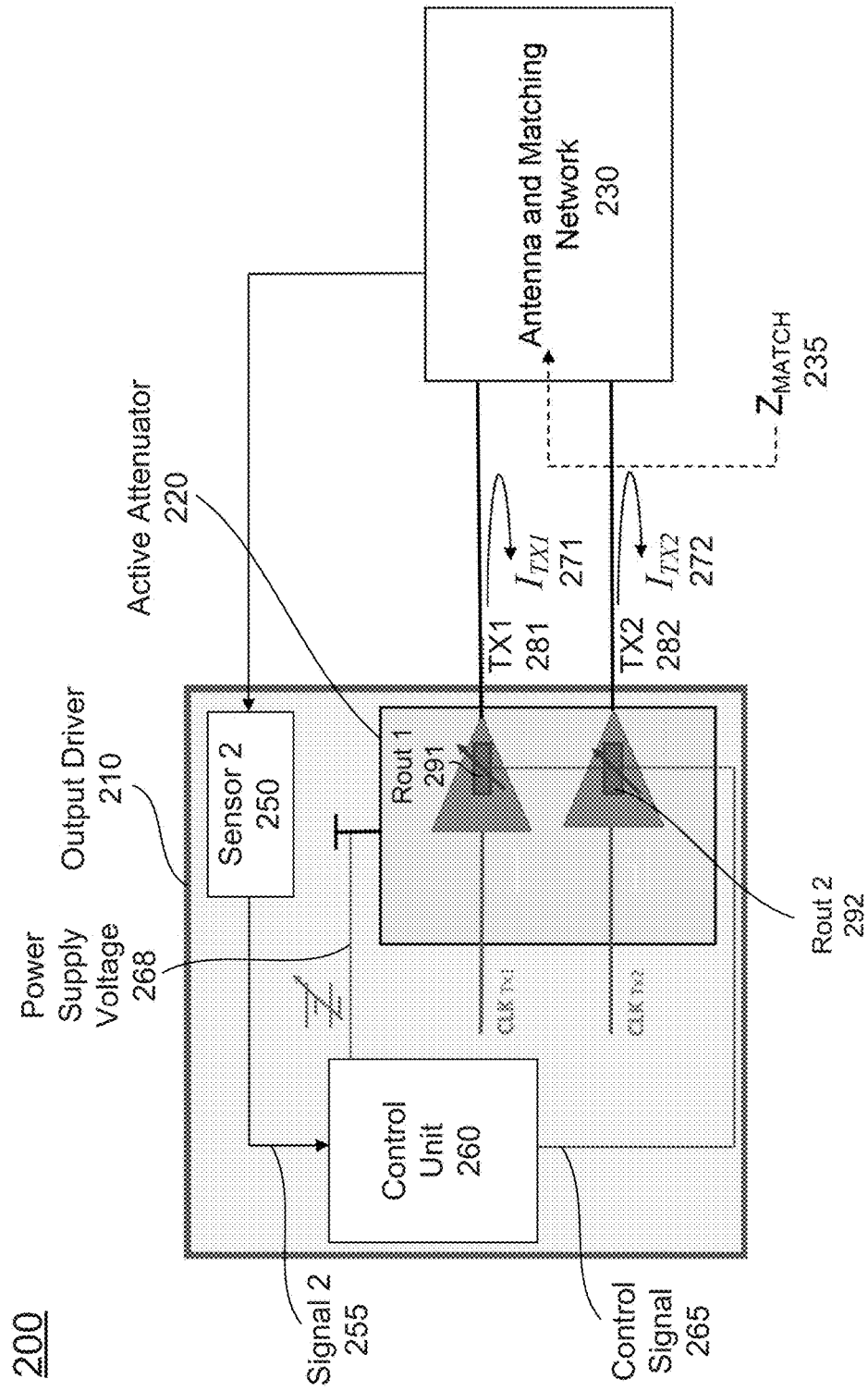
FIG. 2 shows a device (configured for detuning detection and driver output power regulation) that can detect detuning by monitoring for a change in the voltage or current of the antenna and matching network (i.e., indirect regulation), in accordance with some example embodiments.

FIG. 2 shows a device 200 configured for detuning detection and driver output power regulation, in accordance with some example embodiments. In particular, FIG. 2 shows that device 200 can detect detuning by monitoring for a change in the voltage or current of the antenna and matching network (i.e., indirect regulation), in accordance with some example embodiments.

FIG. 2 shows that an output driver 210 of a transmitter is connected to an antenna by means of a matching network. In FIG. 2, the antenna and matching network is labelled as a component 230, which has a corresponding impedance $Z_{MATCH}$ 235. Changing the load on the antenna (such as reading a card) can lead to detuning which changes the impedance $Z_{MATCH}$ 235 at the output of the output driver 210. This leads to a change of the transmitter current $I_{TX1}$ 271 and $I_{TX2}$ 272, which in turn causes a change in the voltage or current of the antenna and matching network 230. In other words, the detuning effect increases or decreases the voltage/current at one or more nodes of the antenna and matching network 230, which is correlated to the variation of the TX current (i.e., $I_{TX1}$ 271, $I_{TX2}$ 272). Therefore, detuning of the antenna and matching network 230 can be detected by a change in the voltage or current of the antenna and matching network 230. Then, in response to detection of the detuning, the TX current can be regulated. This regulation of the TX current results in a reduced driver current and reduced RF field emission, with the benefits of: (1) compliance to regulatory bodies and RF standards in the case of detuning, (2) minimizing device damage, and (3) enhanced user experience in case of battery powered devices.

FIG. 2 shows that the output driver 210 of the transmitter includes an active attenuator 220 at the output stage. Similar to device 100 of FIG. 1, the active attenuator 220 can be configured to generate a transmitter (TX) voltage. In turn, the antenna and matching circuit 230 can be configured to be driven by a TX current corresponding to the TX voltage.

FIG. 2 shows that the active attenuator 220 includes a sensor 2 (labelled 250), which can be used to monitor a voltage or current of the antenna and matching network 230. In one embodiment, only a voltage of the antenna and matching network is monitored, so that detuning of the antenna and matching network is detected by a change in the voltage of the antenna and matching network. In one embodiment, only a current of the antenna and matching network is monitored, so that detuning of the antenna and matching network is detected by a change in the current of the antenna and matching network. In one embodiment, both the voltage and current of the antenna and matching network are monitored, so that detuning of the antenna and matching network is detected by a change in both the voltage and current of the antenna and matching network. This is because detuning of the antenna and matching network can be better detected by monitoring both the change in the voltage and current of the antenna and matching network. In one embodiment, the detuning can be detected by monitoring: (1) only the voltage, (2) only the current, or (3) both the voltage and current of the antenna and matching network. The detection method selected can depend on the precision and speed of detection, as well as the ease and cost of detection and implementation. In one embodiment, sensor 2 (labelled 250) monitors the voltage or current of the antenna and matching network at one node of the antenna and matching network. In one embodiment, sensor 2 (labelled 250) monitors the voltage or current of the antenna and matching network at one or more nodes of the antenna and matching network.

In device 200 of FIG. 2, the output driver 210 can regulate the TX current (i.e., $I_{TX1}$, $I_{TX2}$) by a power supply voltage (268) or internal resistances (i.e., $R_{OUT}1$, $R_{OUT}2$), depending on the sensed voltage or current variation of the antenna and matching network 230. In FIG. 2, internal resistances are shown as $R_{OUT}1$ (291), $R_{OUT}2$ (292), which are included in the active attenuator 220. In one embodiment, the internal resistances can be any transmitter internal resistance, which can be used to regulate the TX current. In one embodiment, the power supply voltage can be any transmitter supply voltage, which can be used to regulate the TX current. In FIG. 2, output voltages (i.e., $V_{TX1}$, $V_{TX2}$) are not shown. In one embodiment, the output voltages (i.e., $V_{TX1}$, $V_{TX2}$) can be the voltages provided at nodes TX1 (281) and TX2 (282).

FIG. 2 shows that the output driver 210 of the transmitter includes a control unit 260 configured to detecting a detuning of the antenna and matching network based on a change in the voltage or current of the antenna and matching network, and, in response to detection of the detuning, regulating the TX current. In FIG. 2, sensor 2 (250) provides a signal 2 (255) to control unit 260. Sensor 2 (250) is monitoring the voltage or current of the antenna and matching network 230, so that signal 2 (255) can be used by the control unit 260 to detect a change in the voltage or current of the antenna and matching network 230. Then, after a detuning of the antenna and matching network has been detected, the control unit 260 can in turn send a control signal 265 to the active attenuator 220 to regulate the TX current by changing the internal resistances (i.e., $R_{OUT}1$, $R_{OUT}2$). In one embodiment, the control unit 260 can regulate the TX current by changing the power supply voltage (268). In one embodiment, the control unit can regulate the TX current by changing: (1) only a transmitter supply voltage, (2) only a transmitter internal resistance, or (3) both the transmitter supply voltage and the transmitter internal resistance. The changing method selected can depend on the precision and speed of change, as well as the ease of change and the manner of implementation. In one embodiment, the control unit 260 can be partially or completely outside of the output driver 210.

Figure 3:
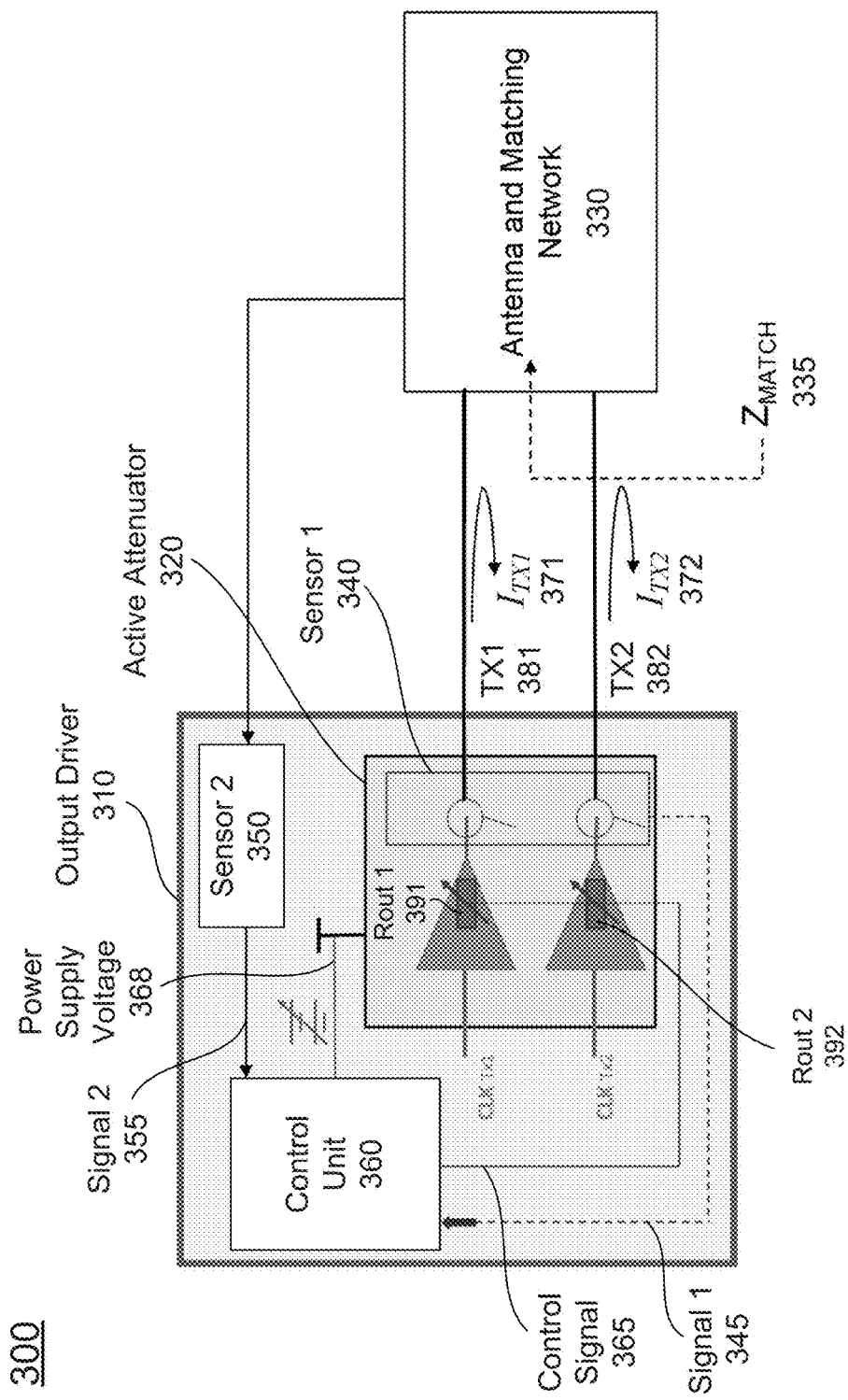
FIG. 3 shows a device (configured for detuning detection and driver output power regulation) that can detect detuning by utilizing the monitoring techniques of both the FIG. 1 and FIG. 2 devices (i.e., combined regulation), in accordance with some example embodiments.

FIG. 3 shows a device 300 configured for detuning detection and driver output power regulation, in accordance with some example embodiments. In particular, FIG. 3 shows that device 300 can detect detuning by utilizing the monitoring techniques of both the FIG. 1 and FIG. 2 devices (i.e., combined regulation), in accordance with some example embodiments. In other words, FIG. 3 utilizes both "direct regulation" and "indirect regulation" (i.e., "combined regulations"). In summary, device 300 of FIG. 3 can detect detuning by monitoring for a change in the transmitter (TX) current and/or voltage (i.e., direct regulation), and/or a change in the voltage or current of the antenna and matching network (i.e., indirect regulation).

FIG. 3 shows that an output driver 310 of a transmitter is connected to an antenna and matching network 330, which has a corresponding impedance $Z_{MATCH}$ 335. Changing the load on the antenna (such as reading a card) can lead to detuning which changes the impedance $Z_{MATCH}$ 335 at the output of the output driver 310. This leads to a change of the transmitter current $I_{TX1}$ 371 and $I_{TX2}$ 372, which in turn causes a change in the voltage or current of the antenna and matching network. Therefore, detuning of the antenna and matching network 330 can be detected by a change in the TX current and/or voltage, and/or a change in the voltage or current of the antenna and matching network 330. Then, in response to detection of the detuning, the TX current can be regulated. This regulation of the TX current results in a reduced driver current and reduced RF field emission, with the same benefits as described for device 100 of FIG. 1 and device 200 of FIG. 2.

FIG. 3 shows that the output driver 310 of the transmitter includes an active attenuator 320 at the output stage. Similar to device 100 of FIG. 1 and device 200 of FIG. 2, the active attenuator 320 can be configured to generate a transmitter (TX) voltage. In turn, the antenna and matching circuit 330 can be configured to be driven by a TX current corresponding to the TX voltage.

FIG. 3 shows that the active attenuator 320 includes two sensors: a sensor 1 (labelled 340) and a sensor 2 (labelled 350). Sensor 1 (340) can be used to monitor the transmitter (TX) current (i.e., $I_{TX1}$ 371 and $I_{TX2}$ 372) and/or voltage. Sensor 2 (350) can be used to monitor a voltage or current of the antenna and matching network 330. In one embodiment, only sensor 1 (340) is used, so that detuning of the antenna and matching network is detected by a change in a change in the TX current and/or voltage. In one embodiment, only sensor 2 (350) is used, so that detuning of the antenna and matching network is detected by a change in the voltage or current of the antenna and matching network 330. In one embodiment, both sensor 1 (340) and sensor 2 (350) are used, so that detuning of the antenna and matching network is detected by a change in the TX current and/or voltage, and/or by a change in the voltage or current of the antenna and matching network 330. This is because detuning of the antenna and matching network can be better detected by using both sensors to monitor the changes in current and voltage. In one embodiment, the detuning can be detected by using: (1) only sensor 1, (2) only sensor 2, or (3) both sensor 1 and sensor 2. The detection method selected can depend on the precision and speed of detection, as well as the ease and cost of detection and implementation.

In device 300 of FIG. 3, the output driver 310 can regulate the TX current (i.e., $I_{TX1}$, $I_{TX2}$) by changing a power supply voltage (368) or internal resistances (i.e., $R_{OUT}1$, $R_{OUT}2$), depending on the sensed current shift of $I_{TX1}$ and $I_{TX2}$ (internal variation), and/or on the voltage and current variation in the antenna and matching network 330. In FIG. 3, internal resistances are shown as $R_{OUT}1$ (391), $R_{OUT}2$ (392), which are included in the active attenuator 320. In one embodiment, the internal resistances can be any transmitter internal resistance, which can be used to regulate the TX current. In one embodiment, the power supply voltage can be any transmitter supply voltage, which can be used to regulate the TX current. In FIG. 3, output voltages (i.e., $V_{TX1}$, $V_{TX2}$) are not shown. In one embodiment, the output voltages (i.e., $V_{TX1}$, $V_{TX2}$) can be the voltages provided at nodes TX1 (381) and TX2 (382).

FIG. 3 shows that the output driver 310 of the transmitter includes a control unit 360 configured to detecting a detuning of the antenna and matching network based on a change in the TX current and/or voltage and/or a change in the voltage or current of the antenna and matching network, and, in response to detection of the detuning, regulating the TX current. In FIG. 3, sensor 1 (340) provides a signal 1 (345) to control unit 360, while sensor 2 (350) provides a signal 2 (355) to control unit 360. Then, after a detuning of the antenna and matching network has been detected, the control unit 360 can in turn send a control signal 365 to the active attenuator 320 to regulate the TX current by changing the internal resistances (i.e., $R_{OUT}1$, $R_{OUT}2$). In one embodiment, the control unit 360 can regulate the TX current by changing the power supply voltage (368). In one embodiment, the control unit can regulate the TX current by changing: (1) only a transmitter supply voltage, (2) only a transmitter internal resistance, or (3) both the transmitter supply voltage and the transmitter internal resistance. The changing method selected can depend on the precision and speed of change, as well as the ease of change and the manner of implementation. In one embodiment, the control unit 360 can be partially or completely outside of the output driver 310.

Figure 4:
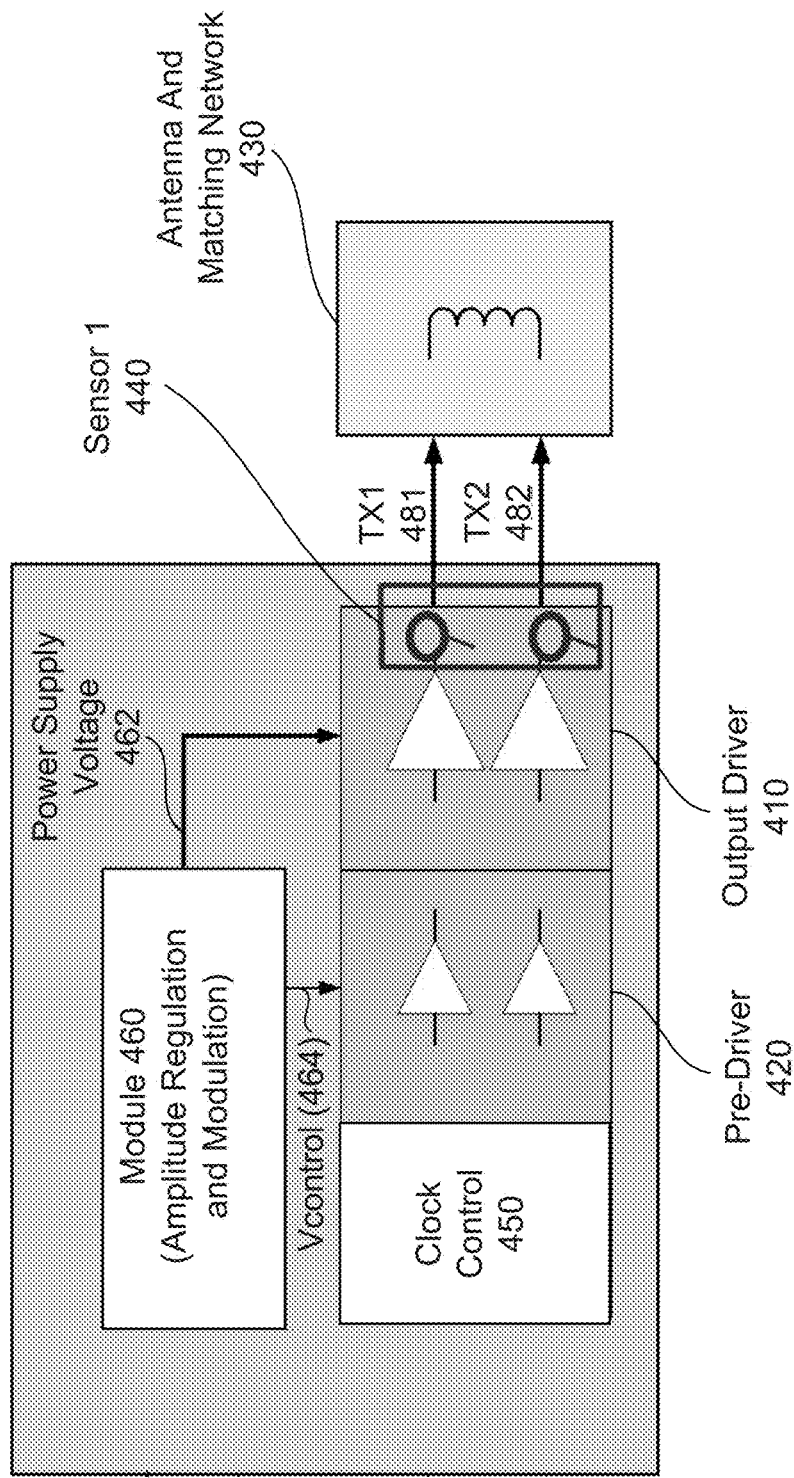
FIG. 4 shows the architecture of a transmitter (TX) related device that is configured for detuning detection and driver output power regulation, in accordance with some example embodiments.

FIG. 4 shows the architecture of a transmitter (TX) related device 400 that is configured for detuning detection and driver output power regulation, in accordance with some example embodiments. In particular, FIG. 4 shows that device 400 includes an output driver 410, a pre-driver 420, a clock control 450, a module 460 (amplitude regulation and modulation), and an antenna and matching network 430. In one embodiment, the pre-driver 420 provides for amplification, while the output driver 410 provides for attenuation.

FIG. 4 shows that the output driver 410 includes a sensor 1 (labelled 440), which can be used to monitor the transmitter (TX) current (i.e., $I_{TX1}$ and $I_{TX2}$) and/or voltage. In one embodiment, only the TX current and/or voltage is monitored, so that detuning of the antenna and matching network is detected by a change in the TX current and/or voltage. It is not shown in FIG. 1, but in one embodiment, the output driver 410 also includes a sensor 2, which can be used to monitor a voltage or current of the antenna and matching network 430. FIG. 4 also shows nodes TX1 (481) and TX2 (482), which are associated with the transmitter (TX) currents $I_{TX1}$ and $I_{TX2}$, respectively.

Module 460 provides for amplitude regulation and modulation. Amplitude regulation controls output power and modulation index. In one embodiment, module 460 provides power supply voltage (462) to the output driver 410 and Vcontrol (464) to the pre-driver 420. In one embodiment, there are different voltages for power supply voltage (462) for different modes, such as reader mode and card mode. In one embodiment, the clock control 450 provides clock control to the pre-driver 420. In one embodiment, a part of or all of the control unit (e.g., 160, 260, 360) can be included in module 460. In one embodiment, a part of or all of the module 460 can be included in the control unit (e.g., 160, 260, 360).

Figure 5:
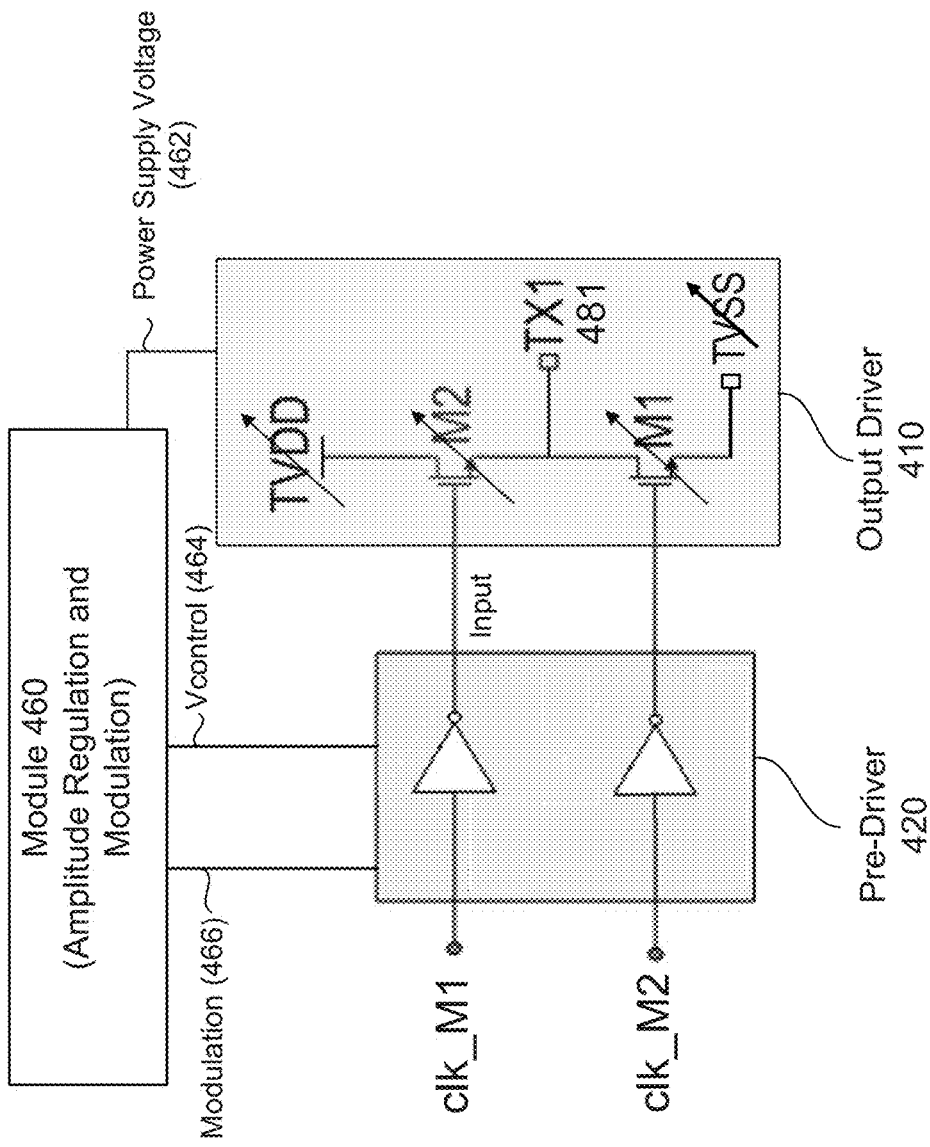
FIG. 5 shows details for a FIG. 4 device, in accordance with some example embodiments.

FIG. 5 shows details for device 400 of FIG. 4, in accordance with some example embodiments. In particular, FIG. 5 shows details for the output driver 410, the pre-driver 420, and the module 460 (amplitude regulation and modulation). In particular, output driver 410 is an active attenuator that is providing active attenuation. The output driver 410 is not an amplifier. This is because TX1 level≤TVDD≤Input level, where TVDD is the power supply voltage. The input signal is greater than TVDD, while TVDD is greater than or equal to the TX1 level, which is the output level. Therefore, the output driver 410 actively attenuates the input signal from the pre-driver 420, while the input signal is amplified (boosted) in the pre-driver 420. In particular, the maximum output voltage level of the output driver 410 is regulated by changing the supply voltage or the output resistance. In one embodiment, attenuation is obtained by reducing the TVDD (which is the power supply voltage) or by changing the number of NMOS (Rout), where NMOS is an n-channel MOSFET (metal-oxide-semiconductor field-effect transistor). In FIG. 5, the high-side transistor of the output driver is M2, which is NMOS. In one embodiment, M1 and M2 can provide the internal resistances (i.e., $R_{OUT}$ 1, $R_{OUT}$ 2) needed for regulating the TX current. In this regard, in one embodiment, M1 and M2 can be an array of transistors that can be turned on or off to produce the required resistance.

Figure 6:
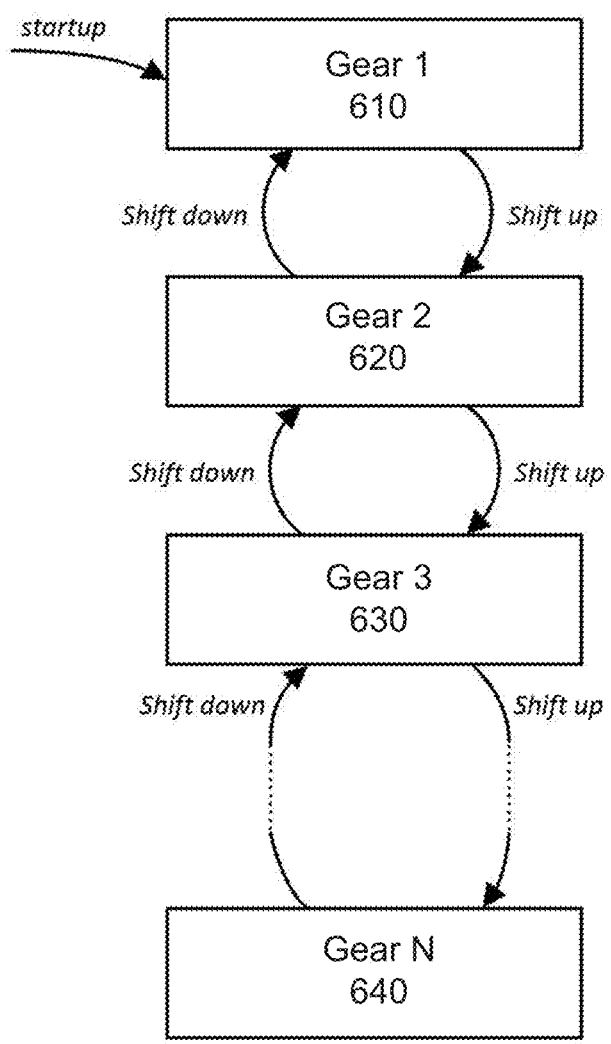
FIG. 6 shows how a transmitter (TX) current can be regulated by using a plurality of gears, wherein each one of the plurality of gears represents a discrete power configuration for the transmitter, in accordance with some example embodiments.

FIG. 6 shows how a transmitter (TX) current can be regulated by using a plurality of gears, wherein each one of the plurality of gears represents a discrete power configuration for the transmitter, in accordance with some example embodiments. In particular, FIG. 6 shows that the TX current can be regulated by using N gears, where each gear represents a discrete power configuration for the transmitter. In FIG. 6, it is shown that there can be Gear 1 (610), Gear 2 (620), Gear 3 (630), . . . , Gear N (640). It is also shown that it is possible to shift up and down between these various gears, and, in one embodiment, the process can start with Gear 1.

An algorithm can be applied to operate a device configured for detuning detection and driver output power regulation, such as one of the devices shown in FIGS. 1-5. In one embodiment, the algorithm can be applied as follows: While the transmitter is generating an RF field, a device configured for detuning detection and driver output power regulation can sense the transmitter (TX) current and/or voltage value periodically. Or, in one embodiment, a device configured for detuning detection and driver output power regulation can sense the transmitter (TX) current and/or voltage value and/or the voltage or current value of the antenna and matching network periodically. If the sensed value exceeds the predefined upper threshold, the TX block configuration shall be updated such that the emitted RF power is reduced (i.e., "Shift down" as shown in FIG. 6). Similarly, if the value is below a lower threshold, the emitted RF power shall be increased again (i.e., "Shift up" as shown in FIG. 6).

To avoid too low (and too high) field emission during the regulation, a discretization of the TX power range in several TX configurations can improve the efficiency and performance of the applied algorithm. Several TX power levels are defined to adapt the device and the communication for varying load conditions. Each relates to a specific register configuration ("gear"). The regulation is based on reading the sensed value and comparing to normalized threshold settings. The gear is then updated accordingly.

In one embodiment, a gear represents the TX configuration in reader mode. Gear 1 reflects the "high power" configuration, so any higher numbered gear will have reduced TX power. The system can be in Gear 1 to N. In one embodiment, the system initially starts in Gear 1. In one embodiment, while in any gear:

(1) Read out sensed value and predict transmitter (TX) current.
(2) If TX current>TX current(max_threshold), then shift down (if possible).
(3) If TX current<TX current(min_threshold), then shift up (if possible).

Figure 7:
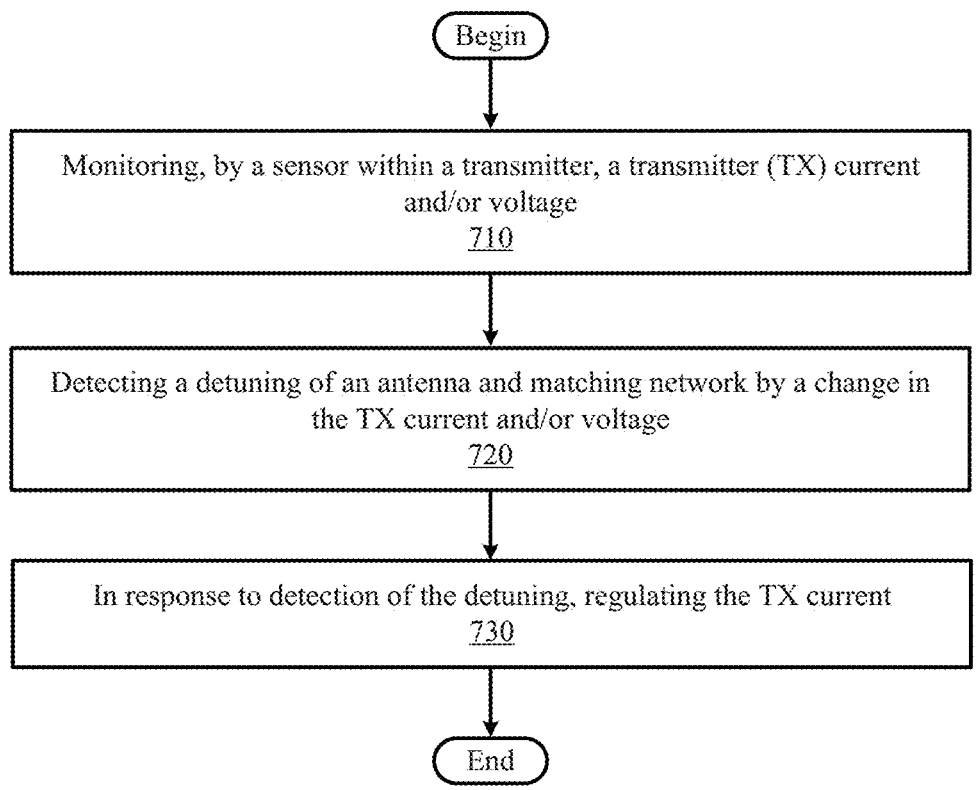
FIG. 7 shows a flow chart of method steps for detuning detection and driver output power regulation, where the detuning is detected by monitoring for a change in the transmitter (TX) current and/or voltage (i.e., direct regulation), in accordance with some example embodiments.

FIG. 7 shows a flow chart of method steps for detuning detection and driver output power regulation, where the detuning is detected by monitoring for a change in the transmitter (TX) current and/or voltage (i.e., direct regulation), in accordance with some example embodiments. As shown in FIG. 7, the method 700 begins at step 710, where the method monitors, by a sensor within a transmitter, a transmitter (TX) current and/or voltage. Then, the method proceeds to step 720. In step 720, the method detects a detuning of an antenna and matching network by a change in the TX current and/or voltage. Next, at step 730, the method, in response to detection of the detuning, regulates the TX current.

Figure 8:
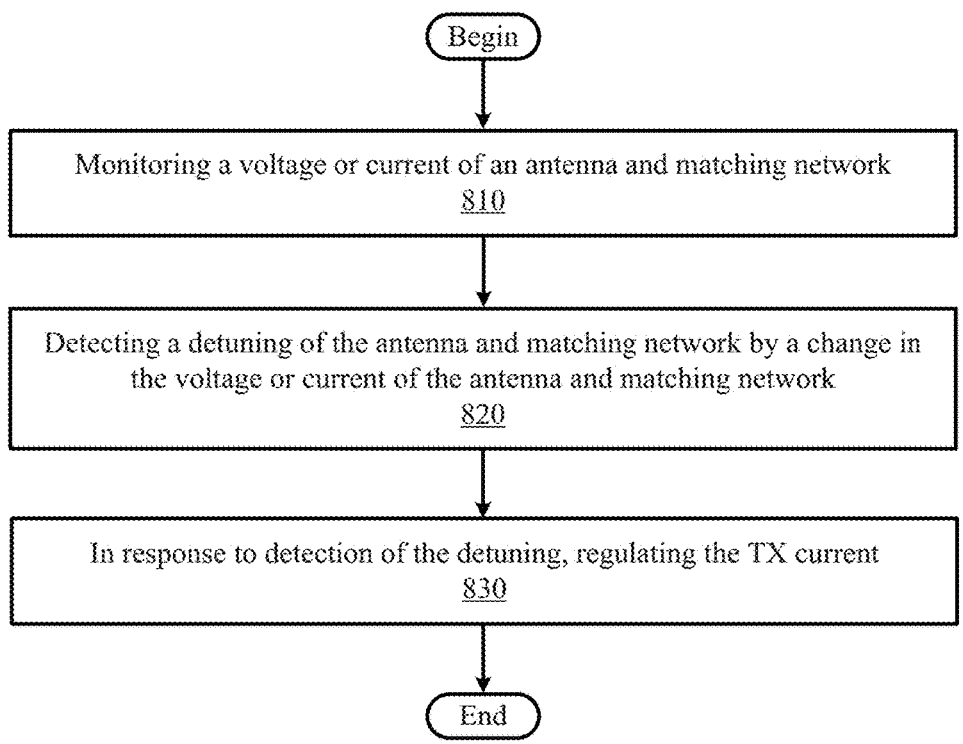
FIG. 8 shows a flow chart of method steps for detuning detection and driver output power regulation, where the detuning is detected by monitoring for a change in the voltage or current of the antenna and matching network (i.e., indirect regulation), in accordance with some example embodiments.

FIG. 8 shows a flow chart of method steps for detuning detection and driver output power regulation, where the detuning is detected by monitoring for a change in the voltage or current of the antenna and matching network transmitter (TX) current (i.e., indirect regulation), in accordance with some example embodiments. As shown in FIG. 8, the method 800 begins at step 810, where the method monitors a voltage or current of an antenna and matching network. Then, the method proceeds to step 820. In step 820, the method detects a detuning of the antenna and matching network by a change in the voltage or current of the antenna and matching network. Next, at step 830, the method, in response to detection of the detuning, regulates the TX current.

Figure 9:
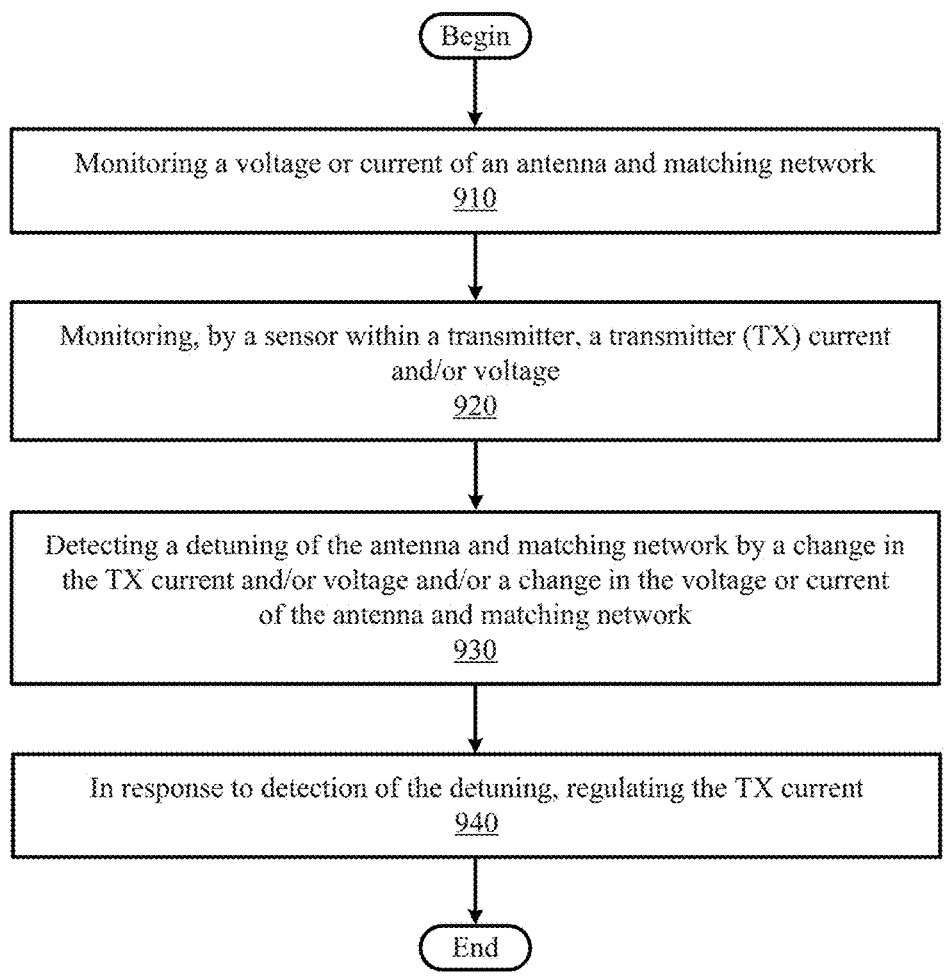
FIG. 9 shows a flow chart of method steps for detuning detection and driver output power regulation, where the detuning is detected by combining the detection methods of both FIG. 7 and FIG. 8 (i.e., combined regulation), in accordance with some example embodiments.

FIG. 9 shows a flow chart of method steps for detuning detection and driver output power regulation, where the detuning is detected by combining the detection methods of both FIG. 7 and FIG. 8 (i.e., combined regulation), in accordance with some example embodiments. As shown in FIG. 9, the method 900 begins at step 910, where the method monitors a voltage or current of an antenna and matching network. Then, the method proceeds to step 920. In step 920, the method monitors, by a sensor within a transmitter, a transmitter (TX) current and/or voltage. Next, at step 930, the method detects a detuning of the antenna and matching network by a change in the TX current and/or voltage and/or a change in the voltage or current of the antenna and matching network. Then, at step 940, the method, in response to detection of the detuning, regulates the TX current.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The various aspects, embodiments, implementations or features of the described embodiments can be used separately or in any combination. Various aspects of the described embodiments can be implemented by software, hardware or a combination of hardware and software.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for detuning detection and transmitter (TX) current regulation, the method comprising:
   monitoring, by a sensor within a transmitter in a transmitter reader mode of a radio frequency (RF) device, a transmitter (TX) current and/or voltage at a maximum predetermined transmitter power level that corresponds to a first operational gear associated with a first corresponding specific register configuration, wherein the TX current and/or voltage is output by an output driver of the transmitter to drive an antenna and matching circuit of the RF device;
   detecting a change in the TX current and/or voltage as output by the output driver, and
   in response to the detected change, detecting an initial detuning of the antenna and matching circuit arising from a load change on the antenna resulting from interaction with a further resonant circuit; and
   in response to detection of the initial detuning, reducing the TX current to match inductance between the antenna and matching circuit and the further resonant circuit by shifting the transmitter power level to one of a plurality of lower discrete gears based on a comparison between a predicted TX current and a plurality of TX current thresholds, wherein each lower discrete gear is associated with a different specific register configuration, and a discrete, predetermined transmitter power level that is below the maximum predetermined transmitter power level, and further wherein the transmitter is configured to initiate reading in highest gear and only shift to a lower gear to match inductance between the antenna and matching circuit and the further resonant circuit.

2. The method of claim 1, wherein the TX current is reduced by changing a transmitter supply voltage or a transmitter internal resistance, wherein monitoring by the sensor further includes monitoring the TX current and the TX voltage, and detecting the initial detuning of the antenna and matching circuit is responsive to the change in the TX current and TX voltage output by the output driver.

3. The method of claim 2, wherein changing the transmitter supply voltage or the transmitter internal resistance is controlled using a control unit including circuitry.

4. The method of claim 3, wherein changing the transmitter supply voltage or the transmitter internal resistance is performed by an active attenuator.

5. The method of claim 1, wherein the transmitter is a Near Field Communication (NFC) transmitter or a Radio Frequency Identification (RFID) transmitter, and further including
   monitoring, by another sensor within the transmitter of the RF device, a change in a voltage and/or current of the antenna and matching circuit, and
   wherein the detecting of the initial detuning of the antenna and matching circuit is responsive to:
      the change in the TX current and/or voltage as output by the output driver; and
      the change in the voltage and/or current of the antenna and matching circuit.

6. The method of claim 1, furthering including:
   monitoring, by another sensor within the transmitter, a voltage or current of an antenna and matching circuit; and
   wherein the detecting further includes:
      detecting a change in the voltage or current of the antenna and matching circuit; and
      in response to the detected change in the voltage or current of the antenna and matching circuit, detecting the initial detuning of the antenna and matching circuit.

7. A method for detuning detection and transmitter (TX) current regulation, the method comprising:
   monitoring, by a sensor within a transmitter of a radio frequency (RF) device, a transmitter (TX) voltage and/or current as output by an output driver of the transmitter to drive an antenna and matching circuit of the RF device, wherein the antenna and matching circuit is in a transmitter reader mode at a maximum predetermined transmitter power level that corresponds to a first operational gear associated with a first corresponding specific register configuration;

detecting a change in the TX voltage and/or current using the sensor;

detecting, in response to the detected change, an initial detuning of the antenna and matching circuit arising from a load change on the antenna resulting from interaction with a further resonant circuit; and in response to detection of the initial detuning, reducing the transmitter (TX) current to match inductance between the antenna and matching circuit and the further resonant circuit by shifting the transmitter power level to one of a plurality of lower gears based on a comparison between a predicted TX current and a plurality of TX current thresholds, wherein each lower gear is associated with a different specific corresponding register configuration, and a discrete, predetermined transmitter power level that is below the maximum predetermined transmitter power level, and further wherein the transmitter is configured to initiate reading in highest gear and only shift to a lower gear to match inductance between the antenna and matching circuit and the further resonant circuit.

8. The method of claim 7, wherein reduction of the TX current is achieved by changing a transmitter supply voltage or a transmitter internal resistance.

9. The method of claim 8, wherein changing the transmitter supply voltage or the transmitter internal resistance is controlled using a control unit.

10. The method of claim 9, wherein changing the transmitter supply voltage or the transmitter internal resistance is performed by an active attenuator.

11. The method of claim 7, further comprising:
monitoring a voltage or current at one or more nodes of the antenna and matching circuit.

12. The method of claim 7, further comprising:
monitoring, by a sensor within a transmitter, a transmitter (TX) current and/or voltage; and
detecting
a change in the TX current and/or voltage,
in response to the detected change in the TX current and/or voltage and a detected change in the voltage or current of the antenna and matching circuit, the detuning of the antenna and matching circuit by a change in the TX current and/or voltage and/or a change in the voltage or current of the antenna and matching circuit.

13. The method of claim 7, wherein the transmitter is a Near Field Communication (NFC) transmitter or a Radio Frequency Identification (RFID) transmitter.

14. A device for detuning detection and transmitter (TX) current regulation, the device comprising:
a transmitter circuit including:
an active attenuator configured to generate a transmitter (TX) voltage;
a first sensor;
a second sensor;
an output driver configured and arranged to output an TX current and/or voltage; and
a control unit; and
an antenna and matching circuit configured to be driven by the TX current corresponding to the TX voltage as output by the output driver, wherein
the first sensor is configured to monitor the TX current and/or voltage;
the second sensor is configured to monitor a voltage or current of the antenna and matching circuit; and
the control unit, including circuitry, configured to:
detect a change in the TX current and/or voltage as output by the output driver and a change in the voltage or current of the antenna and matching circuit;
detect, in response to the detected change in the TX current and/or voltage and the detected change in the voltage or current of the antenna and matching circuit, an initial detuning of the antenna and matching circuit arising from a load change on the antenna resulting from interaction with a further resonant circuit, and
in response to detection of the initial detuning, reduce the TX current to match inductance between the antenna and matching circuit and the further resonant circuit, wherein the device is configured to initially operate at a maximum predetermined transmitter power level that corresponds to a first operational gear associated with a first corresponding specific register configuration, and further wherein inductance is matched between the antenna and matching circuit and the further resonant circuit by shifting the transmitter power level to one of a plurality of lower gears based on a comparison between a predicted TX current and a plurality of TX current thresholds, wherein each lower gear is associated with a different specific corresponding register configuration, and a discrete, predetermined transmitter power level that is below the maximum predetermined transmitter power level.

15. The device of claim 14, wherein the control unit reduces the TX current by changing a TX supply voltage or a TX internal resistance.

16. The device of claim 15 further comprising:
a pre-driver configured to generate an amplified signal for input to the active attenuator.

17. The device of claim 16, wherein the second sensor monitors the voltage or current of the antenna and matching circuit at one or more nodes of the antenna and matching circuit.

18. The device of claim 14, wherein the device is a Near Field Communication (NFC) device or a Radio Frequency Identification (RFID) device.

19. The device of claim 14, wherein the control unit, including the circuitry, is further configured to detect the initial detuning of the antenna and matching circuit in response to the detected change in the TX current and/or voltage and the detected change in the voltage or current of the antenna and matching circuit.

* * * * *